(12) United States Patent
Song

(10) Patent No.: US 8,193,536 B2
(45) Date of Patent: Jun. 5, 2012

(54) LIGHT EMITTING DEVICE

(75) Inventor: Hyun Don Song, Incheon (KR)

(73) Assignee: LG Innotek Co., Ltd., Seoul (KR)

( * ) Notice: Subject to any disclaimer, the term of this patent is extended or adjusted under 35 U.S.C. 154(b) by 111 days.

(21) Appl. No.: 12/693,239

(22) Filed: Jan. 25, 2010

(65) Prior Publication Data

US 2010/0230699 A1    Sep. 16, 2010

(30) Foreign Application Priority Data

Mar. 13, 2009   (KR) .................. 10-2009-0021441

(51) Int. Cl.
*H01L 29/04*    (2006.01)
(52) U.S. Cl. ................. 257/74; 257/94; 257/97
(58) Field of Classification Search .......... 257/74, 257/94, 97
See application file for complete search history.

(56) References Cited

U.S. PATENT DOCUMENTS

| | | | |
|---|---|---|---|
| 7,118,438 B2 * | 10/2006 | Ouderkirk et al. | 445/24 |
| 7,223,998 B2 * | 5/2007 | Schwach et al. | 257/86 |
| 2001/0013605 A1 * | 8/2001 | Umezaki et al. | 257/13 |
| 2002/0008241 A1 * | 1/2002 | Edmond et al. | 257/77 |
| 2004/0144986 A1 | 7/2004 | Chen et al. | |
| 2005/0265404 A1 * | 12/2005 | Ashdown | 372/20 |
| 2007/0080352 A1 * | 4/2007 | Wu et al. | 257/79 |
| 2007/0170448 A1 * | 7/2007 | Ito et al. | 257/98 |

FOREIGN PATENT DOCUMENTS

| | | |
|---|---|---|
| CN | 1838439 A | 9/2006 |
| CN | 101271940 A | 9/2008 |
| JP | 2008-235319 A | 10/2008 |
| KR | 10-0643471 B1 | 10/2006 |
| KR | 10-2006-0112872 A | 11/2006 |
| KR | 10-2006-0114920 A | 11/2006 |
| KR | 10-2006-0125079 A | 12/2006 |
| KR | 10-2007-0042214 A | 4/2007 |
| KR | 10-2008-0000884 A | 1/2008 |

* cited by examiner

*Primary Examiner* — Howard Weiss
*Assistant Examiner* — Steven Rao
(74) *Attorney, Agent, or Firm* — Birch, Stewart, Kolasch & Birch, LLP

(57) ABSTRACT

A light emitting device including a light emitting structure having a first conductive semiconductor layer, an active layer and a second conductive semiconductor layer; a first electrode on the light emitting structure; and a photon escape layer on the light emitting structure. Further, the photon escape layer has a refractive index that is between a refractive index of the light emitting structure and a refractive index of an encapsulating material with respect to the light emitting structure such that an escape probability for photons emitted by the light emitting structure is increased.

20 Claims, 9 Drawing Sheets

LIGHT EMITTING DEVICE

CROSS-REFERENCE TO RELATED APPLICATIONS

The present application claims the benefit under 35 U.S.C. §119 to Korean Patent Application No. 10-2009-0021441, filed on Mar. 13, 2009, which is hereby incorporated by reference in its entirety.

BACKGROUND OF THE INVENTION

1. Field of the Invention

The present disclosure relates to a light emitting device.

2. Discussion of the Background

Light Emitting Devices include P—N junction diodes that convert electrical energy into light energy. The diodes are formed by combining group III and V elements on the periodic table. Light Emitting Devices also emit various colors of light by controlling the composition ratio of compound semiconductors.

In more detail, when a forward voltage is applied, an electron of an n-layer is combined with a hole of a p-layer to emit energy corresponding to an energy gap between the conduction band and the valance band. The energy is then emitted as light. Also, nitride semiconductors, for example, are used in optical devices and high-power electronic devices, because of their high thermal stability and wide band gap energy. In particular, blue LEDs, green LEDs, and UV LEDs that use nitride semiconductors are available. However, the light emitting devices only output a small amount of light.

SUMMARY

Accordingly, one object of the present invention is to address the above-noted and other objects of the present invention.

Another object of the present invention is to provide a light emitting device with an improved extraction efficiency.

To achieve these and other advantages and in accordance with the purpose of the present invention, as embodied and broadly described herein, the present invention provides in one aspect a light emitting device including a light emitting structure having a first conductive semiconductor layer, an active layer, and a second conductive semiconductor layer; a first electrode on the light emitting structure; and a photon escape layer on the light emitting structure. Further, the photon escape layer has a refractive index that is between a refractive index of the light emitting structure and a refractive index of an encapsulating material with respect to the light emitting structure such that an escape probability for photons emitted by the light emitting structure is increased.

In another aspect, the present invention provides a light emitting device including a photon escape layer on a light emitting structure; a first electrode on the light emitting structure; a pad on the first electrode; and a second electrode under the light emitting structure. Further, the photon escape layer has a refractive index that is between a refractive index of the light emitting structure and a refractive index of an encapsulating material with respect to the light emitting structure such that an escape probability for photons emitted by the light emitting structure is increased.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Reference will now be made in detail to the embodiments of the present disclosure, examples of which are illustrated in the accompanying drawings.

The embodiments of the present invention improve the light emitting efficiency of the light emitting device. In more detail, the embodiments of the present invention improve an extraction efficiency (which is an external quantum efficiency). That is, the embodiments of the present invention increase the probability that light generated from an active layer is emitted outside of the device. The embodiments will now be described in more detail with respect to the figures.

Figure 1:
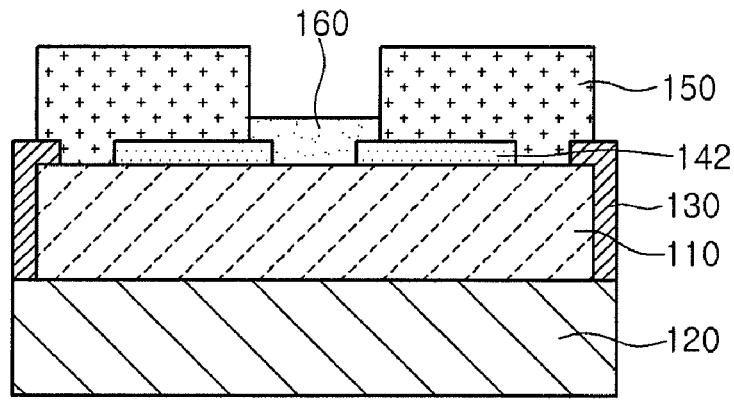
FIGS. 1 and 2 are respectively a sectional view and a plan view of a light emitting according to a first embodiment of the present invention.
Figure 2:
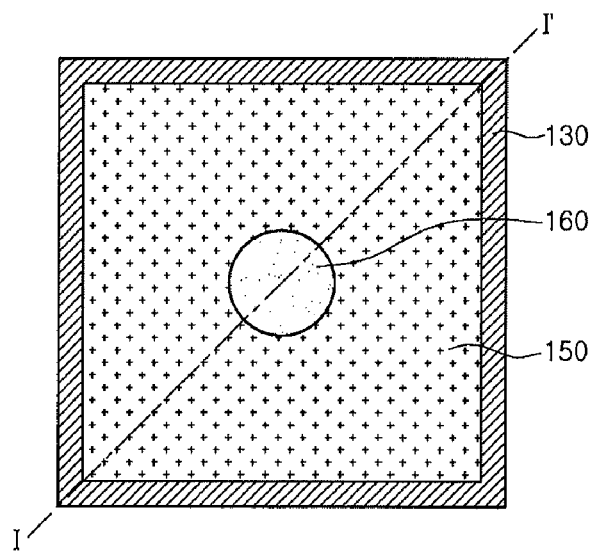

In particular, FIG. 2 is a plan view of a light emitting device according to an embodiment of the present invention, and FIG. 1 is a cross-section view taken along the line I-I' in FIG. 2. As shown in FIGS. 1 and 2, the light emitting device includes a light emitting structure 110, a second electrode layer 120, an insulating layer 130, a first electrode 142, a photon escape layer 150 and a pad 160. The light emitting structure 110 also includes a first conductive semiconductor layer 112, an active layer 114, and a second conductive semiconductor layer 116 (see FIG. 4).

In FIGS. 1 and 2, the insulating layer 130 is also formed around the light emitting structure 110, and the first electrode 142 is disposed on the light emitting structure 110. The photon escape layer 150 is also disposed on the light emitting structure 110, and the pad 160 is disposed on the first electrode 142 and the light emitting structure.

The light emitting device according to the embodiment of the present invention improves the extraction efficiency of the device by depositing or re-growing the photon escape layer 150 on the light emitting structure 110 so as to expand an escape path of photons. In more detail, the light emitting device according to the present embodiment does not interrupt the path of photons without an internal scattering factor by employing a photon escape layer, and does not bias the escape path of photons to provide a wider-angle escape path. That is, the escape path of photons according to refraction or reflection, which are internal scattering factors, enables an escape of photons due to a wide escape angle.

The light emitting device according to the present embodiment can form the photon escape layer 150 through a deposition or a re-growth process and by selectively applying the physical properties related to refractive index. Also, an escape path of photons is ensured by a difference of refractive index, when a surface junction unit is formed according to a package molding material. Thus, the escape path of photons is broadened by forming a material considering the difference of refraction index between a light emitting structure and a background material. Accordingly, the escape paths of photons generated from an active layer are increased to improve the extraction efficiency.

Hereinafter, a method of manufacturing a light emitting device according to the first embodiment will be described with reference to FIGS. 3 to 23. Although a process of removing a first substrate is described in the first embodiment after the light emitting structure 110 is formed on the first substrate, a method of forming the light emitting structure 110 on a conductive substrate such as the second electrode layer 120 may be applied.

Figure 3:
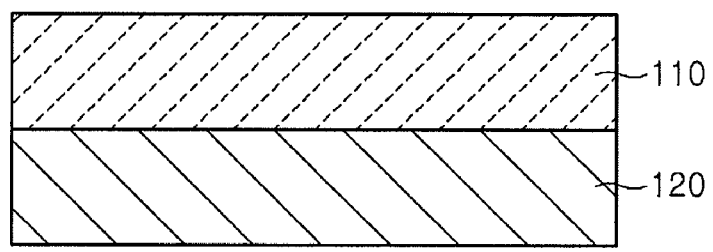
FIGS. 3 to 23 are overviews illustrating a method of manufacturing a light emitting device according to the first embodiment of the present invention.

First, as shown in FIG. 3, the second electrode layer 120 is formed under the light emitting structure 110 on a prepared first substrate (not shown). The first substrate may be a sapphire ($Al_2O_3$) single crystal substrate or a SiC substrate, but is not limited thereto. A wet-washing process may also be performed on the first substrate to remove impurities.

Figure 4:
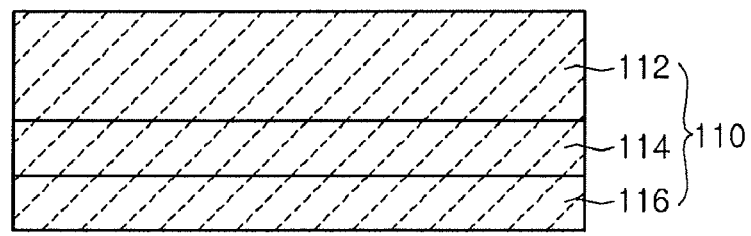

As illustrated in FIG. 4, the light emitting structure 110 includes the first conductive semiconductor layer 112, the active layer 114, and the second conductive semiconductor layer 116. An undoped semiconductor layer can also be formed on the first conductive semiconductor layer 112. Also, the light emitting structure 110 may be a GaN semiconductor layer, but is not limited thereto.

Next, a process for forming the light emitting structure 110 and the second electrode layer 120 will be described in more detail. The first conductive semiconductor layer 112 may include an N-type GaN layer through a Chemical Vapor Deposition (CVD) process, a Molecular Beam Epitaxy (MBE) process, a sputtering process, or a Hydride Vapor Phase Epitaxy (HVPE) process. The first conductive semiconductor layer 112 may also be formed by implanting a trimethyl gallium gas (TMGa), an ammonium gas ($NH_3$), a nitrogen gas ($N_2$), and a silane gas ($SiH_4$) including an n-type impurity such as silicon (Si) into a chamber.

Further, the active layer 114 is a layer emitting light having energy determined by an intrinsic energy band of an active layer (light emitting layer) material when electrons injected from the first conductive semiconductor layer 112 meet holes injected from the second conductive semiconductor layer 116. The active layer 114 can also have a quantum well structure that is formed by alternate or successive lamination of nitride semiconductor thin layers having different energy bands. For example, the active layer 114 may be formed in a multi quantum well structure having an InGaN/GaN structure by being injected with a trimethyl gallium gas (TMGa), an ammonium gas ($NH_3$), a nitrogen gas ($N_2$), and a Trimethyl indium gas (TMIn).

Further, the second conductive semiconductor layer 116 may, for example, include a p-type GaN layer formed by implanting a trimethyl gallium gas (TMGa), an ammonium gas ($NH_3$), a nitrogen gas ($N_2$), and bis-ethylcyclopentadienyl magnesium $EtCp_2Mg$ {$Mg(C_2H_5C_5H_4)_2$} including a p-type impurity such as magnesium (Mg) into a chamber.

Figure 5:
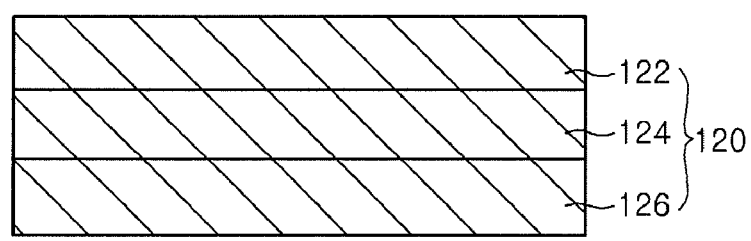

Next, as shown in FIG. 5, the second electrode layer 120 includes an ohmic layer 122, a reflection layer 124, an adhesive layer 126 and a second substrate (not shown). The ohmic layer 122 can be formed by stacking a single metal, a metal alloy, and a metal oxide in a multi-layer for an efficient hole injection. For example, the ohmic layer 122 may include at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO. Other materials may also be used.

In addition, the reflection layer 124 may be formed of a metal layer including Al, Ag or an alloy thereof, etc. Also, when the embodiment includes the adhesive layer 126, the reflection layer 124 may perform the function of the adhesive layer 126, or the adhesive layer 126 may be formed using Ni or Au. Further, the second electrode layer 120 may include a second substrate. If the first conductive semiconductor layer 112 has an enough thickness of about 50 μm or more, a process of forming the second substrate may be omitted. The second substrate may also be formed of a material having an excellent conductivity such as a metal, a metal alloy or a conductive semiconductor for an efficient hole injection. For example, the second substrate may be formed of at least one of Cu, Cu alloy, Si, Mo and SiGe. The second substrate may also be formed by an electrochemical metal vapor deposition process or a bonding process using a eutectic metal.

In addition, the first substrate is removed to expose the first conductive semiconductor layer 112. The first substrate may be removed using a high-power laser or a chemical etching method or be removed by a physical polishing method.

Figure 6:
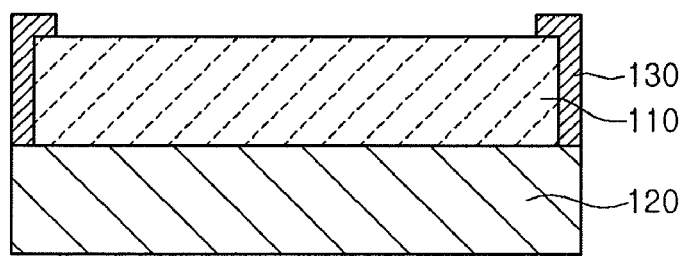
Figure 7:
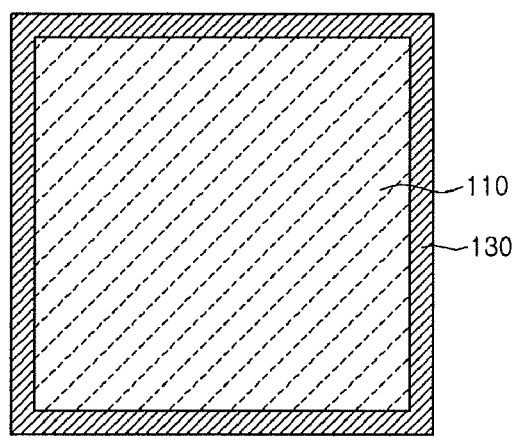

As shown in FIGS. 6 and 7, the insulating layer 130 is formed around the light emitting structure 110. For example, after an outer portion of the first conductive semiconductor layer 112, the active layer 114 and the second conductive semiconductor layer 116 is removed, the insulating layer 130 can be formed using an oxide or a nitride to form a passivation layer.

Figure 8:
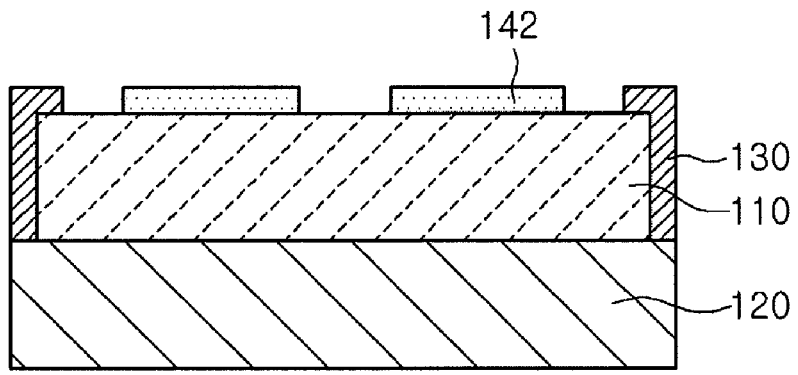
Figure 9:
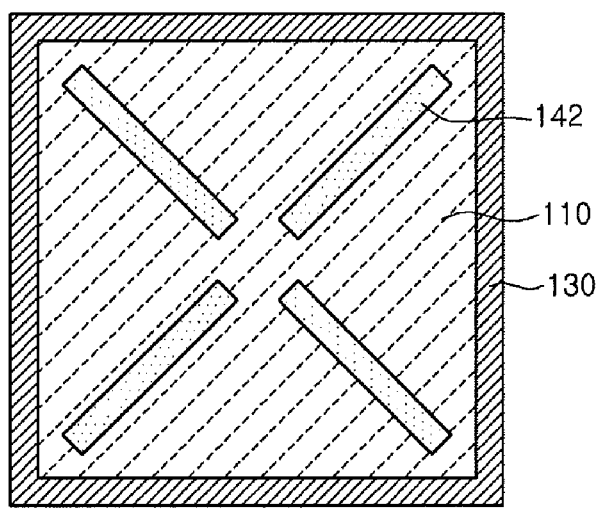

As shown in FIGS. 8 and 9, the first electrode 142 is formed on the light emitting structure 110. The first electrode 142 may be formed so as to contact a wider area of the light emitting structure 110 while not interfering with emitted light. For example, the first electrode 142 may be formed in a wing type or a lattice pattern.

Figure 10:
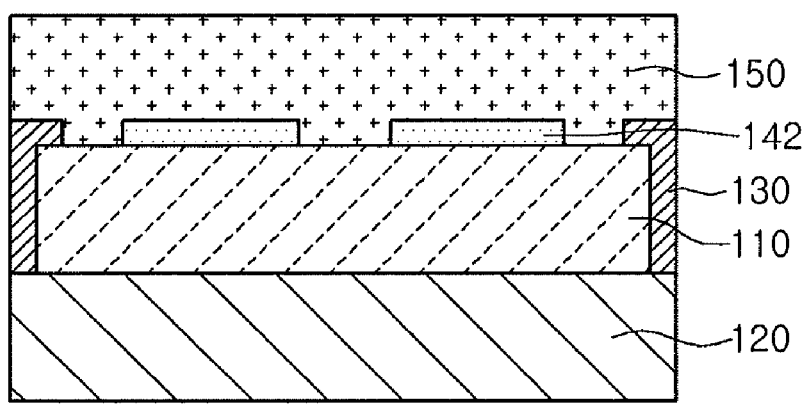
Figure 11:
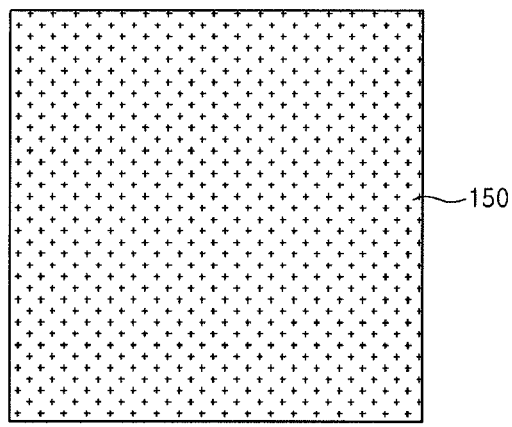

As shown in FIGS. 10 and 11, the photon escape layer 150 is formed on the light emitting structure 110. The photon escape layer 150 is also formed of a material considering a difference of refractive index between the light emitting structure 110 and a background material so as to expand the escape path of photons. Thus, the escape paths of photons generated from the active layer 114 are increased to improve the extraction efficiency of the device.

The first embodiment illustrates a method of forming the photon escape layer 150 using a deposition method. However, a growth method as described in the following second embodiment also may be used.

Also, because the photon escape layer 150 is formed by a deposition method according to the first embodiment, the photon escape layer 150 may also be formed on the first electrode 142 and the insulating layer 130. The photon escape layer 150 may also be formed of a dielectric film or a conductive film, which have a refractive index between a refractive index of the light emitting structure 110 and a refractive index of the background (e.g., an encapsulating material, air, etc).

Further, the photon escape layer 150 may be formed at least one of $TiO_2$, $Al_2O_3$, ZnO, $MgF_2$, $In_2O_3$, $SnO_2$, $TiN_x$, $Ga_2O_3$, ITO, In—Zn—O, and ZnO:Al to prevent a loss of the amount of photons. Also, because the photon escape layer 150 has a refractive index between the light emitting structure 110 and the background material, the photon escape layer 150 provides an escape path of the amount of photons generated from the active layer 114.

In addition, a material that may serve as the photon escape layer 150 may be a transmitting layer complying with the Lambertian Law, and may be disposed on the upper part of the light emitting surface of the light emitting structure 110 to provide a photon escape path. Further, the photon escape layer 150 may include a conductive film besides a dielectric film. The conductive film may be an oxide, a fluoride or a nitride film, and may have a refractive index between the light emitting structure 110 and the background material as a material forming the photon escape layer 150.

Figure 12:
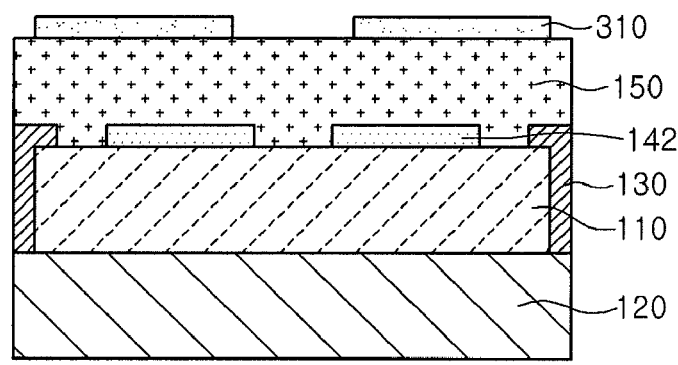
Figure 13:
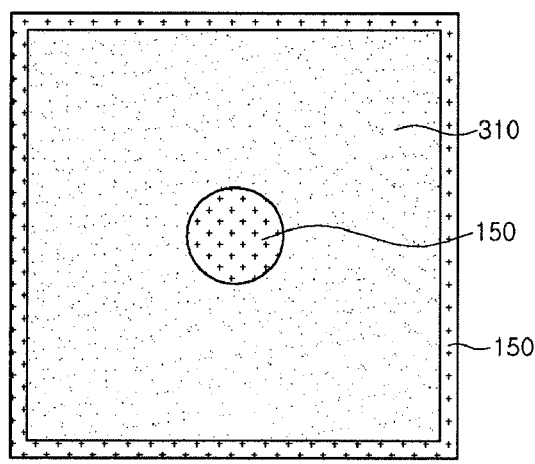

As shown in FIGS. 12 and 13, a first pattern 310 is formed to expose a pad region. For example, the first pattern 310 may be formed of a photo-sensitive film or an insulating film, but is not limited thereto. Further, as shown, the first pattern 310 exposes an outer portion of the photon escape layer 150.

Figure 14:
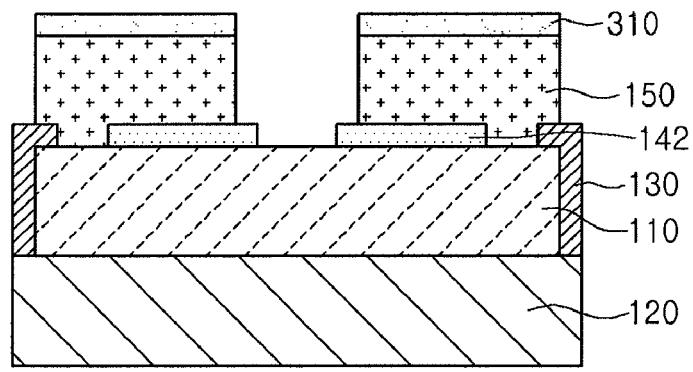
Figure 15:
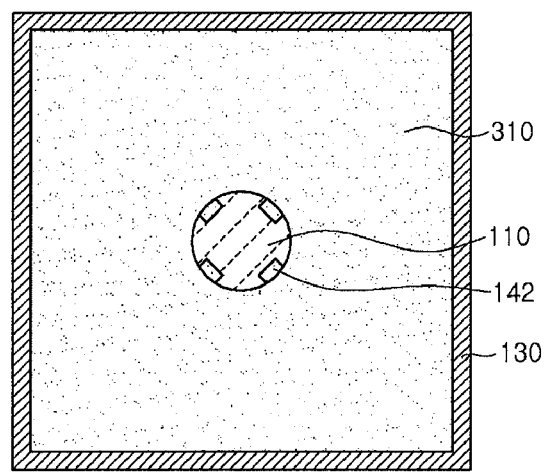

As shown in FIGS. 14 and 15, the first electrode 142 is partially exposed by partially removing the photon escape layer 150 in the pad region through a wet-etching or a dry-etching process using the first pattern 310 as a mask. In this instance, the light emitting structure 110 in the pad region is also partially exposed, and an outer portion of the photon escape layer 150 is partially removed.

Figure 16:
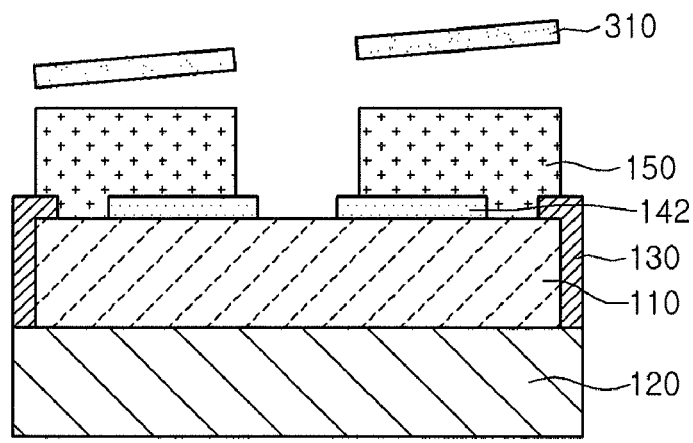
Figure 17:
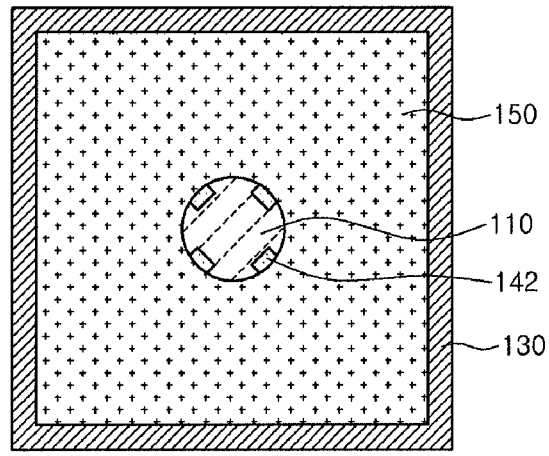
Figure 18:
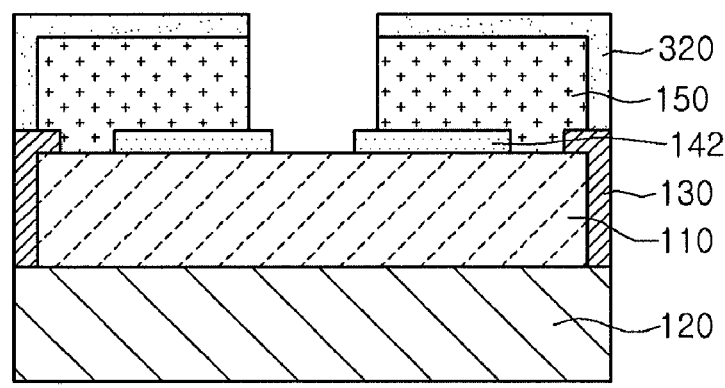
Figure 19:
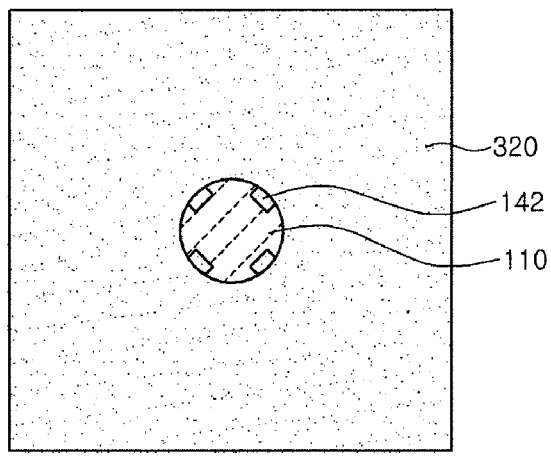

As shown in FIGS. 16 and 17, the first pattern 310 is removed. For example, if the first pattern 310 is a photo-sensitive film, the first pattern 310 may be removed through an ashing process. If the first pattern 310 is an insulating film, the first pattern 310 may be removed through a wet-etching or other process. As shown in FIGS. 18 and 19, a second pattern 320 is formed on a region except the exposed first electrode 142 using a mask pattern or an insulating film. In this instance, the light emitting structure 110 in a pad region except the first electrode 142 is partially exposed by the second pattern 320.

Figure 20:
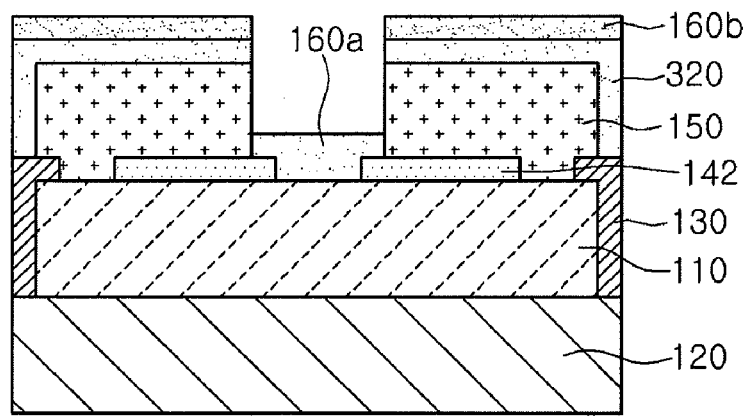
Figure 21:
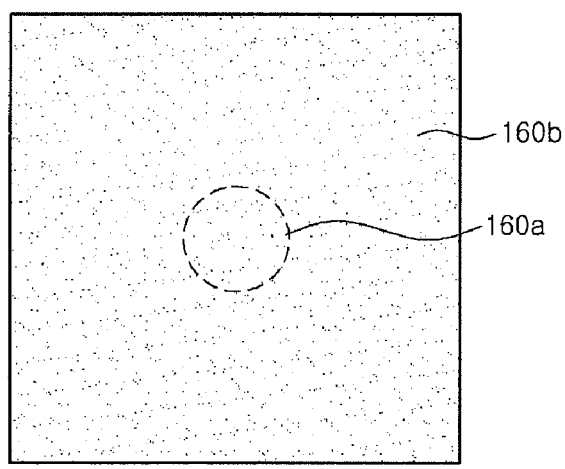
Figure 22:
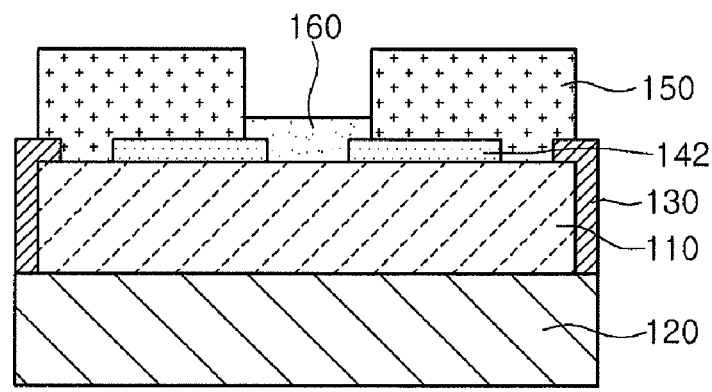
Figure 23:
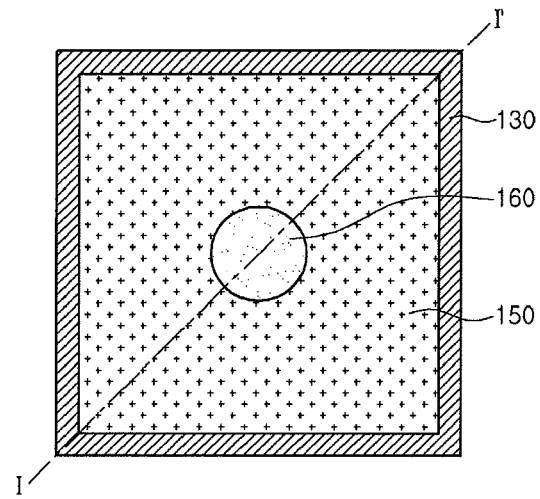

As shown in FIGS. 20 and 21, a pad material 160a and 160b is formed on the light emitting structure 110 including the second pattern 320. In this example, the pad material includes the pad material 160a formed on the second pattern 320, and the pad material 160b formed on the exposed first electrode 142. As shown in FIGS. 22 and 23, the pad 160 is formed on the first electrode 142 by removing the second pattern 320. For example, since the pad material 160b is removed together with the second pattern 320, the pad material 106a remains on the first electrode 142 to form the pad 160.

Figure 24:
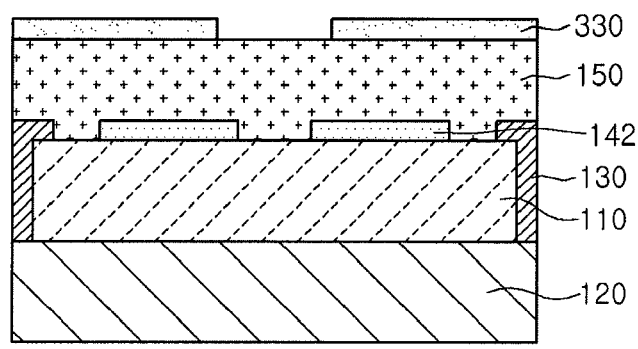
FIGS. 24 to 26 are overviews illustrating another method of manufacturing a light emitting device according to the first embodiment of the present invention.
Figure 25:
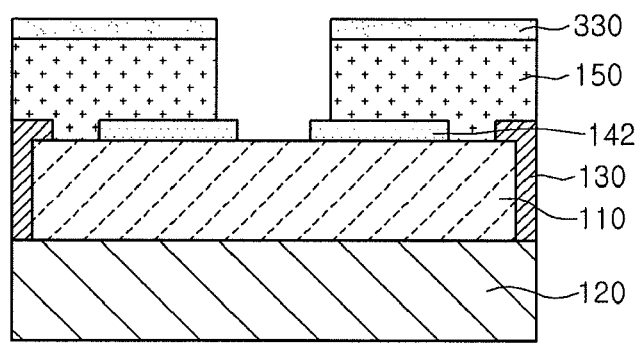
Figure 26:
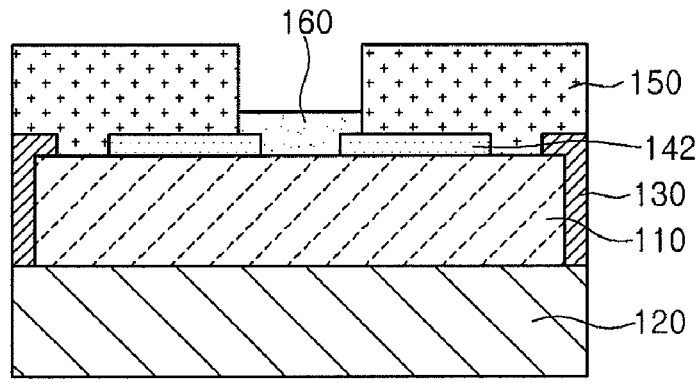

Next, FIGS. 24 to 26 are overviews illustrating another method of manufacturing a light emitting device according to the first embodiment. As shown in FIG. 24, a third pattern 330 is formed to expose a pad region. For example, the third pattern 330 may be formed of a photo-sensitive film or an insulating film. The third pattern 330 is also formed at an outer portion of the photon escape layer 150.

As shown in FIG. 25, the photon escape layer 150 in the pad region is partially removed through a wet-etching or a dry-etching process to partial expose the first electrode 142. Also, the light emitting structure 110 in the pad region may also be partially exposed. As shown in FIG. 26, a pad material is formed on the light emitting structure 110 including the third pattern 330. The pad 160 may also be formed on the first electrode 142 by removing the third pattern 330.

Thus, in the light emitting device according to the above-embodiments of the present invention, an escape path of photons is broadened by forming a material considering a difference of refraction index between a light emitting structure and a background material. Accordingly, the escape paths of photons generated from the active layer are increased to improve the extraction efficiency of the device.

Figure 27:
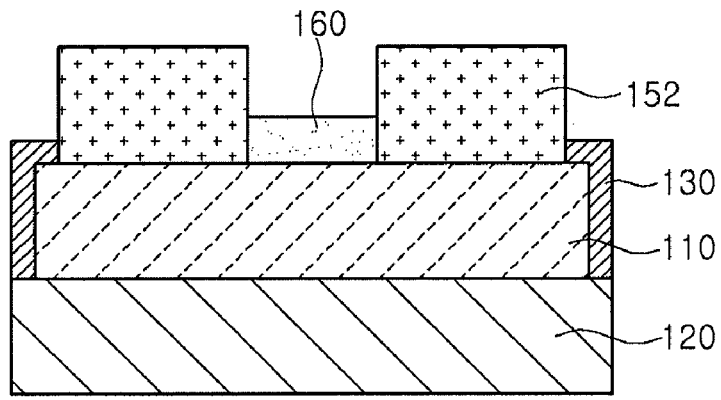
FIGS. 27 and 28 are respectively a sectional view and a plan view of a light emitting device according to a second embodiment of the present invention.
Figure 28:
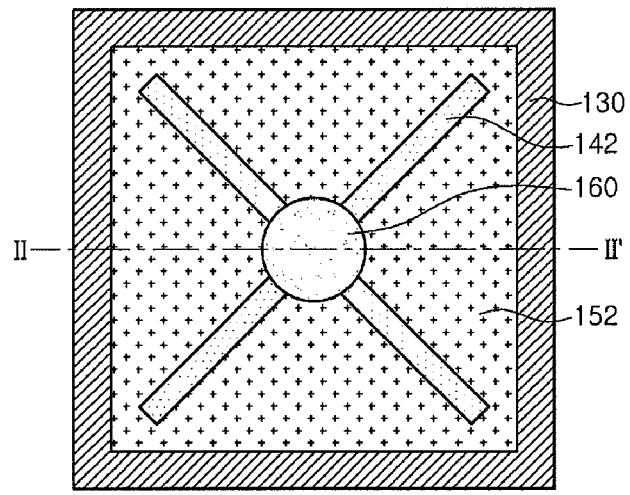

Next, FIGS. 27 and 28 are respectively a sectional view and a plan view of a light emitting device according to a second embodiment of the present invention. In particular, FIG. 27 is a cross-section view taken along the line II-II' in FIG. 28.

In more detail, the first embodiment relates to a method of manufacturing the photon escape layer 150 using a deposition process. As shown in FIGS. 27 and 28, the second embodiment relates to a method of manufacturing a photon escape layer 152 using a growth process. For example, the photon escape layer 152 may be formed through an epitaxial growth process. Also, since the photon escape layer 152 is formed by a growth process in the second embodiment, the photon escape layer 152 may not be formed on the first electrode 142 and the insulating layer 130 as shown in FIGS. 27 and 28.

Also, a reference in this specification to "one embodiment," "an embodiment," "example embodiment," etc., means that a particular feature, structure or characteristic described in connection with the embodiment is included in at least one embodiment of the invention. The appearances of such phrases in various places in the specification are not necessarily all referring to the same embodiment. Further, when a particular feature, structure or characteristic is described in connection with any embodiment, it is submitted that it is within the purview of one skilled in the art to affect such feature, structure, or characteristic in connection with other ones of the embodiments.

In addition, in the above-description of the embodiments, when a layer (or film) is referred to as being 'on/over' another layer or substrate, it can be directly on/over another layer or substrate, or intervening layers may also be present. Further, when a layer is referred to as being 'under/below' another layer, it can be directly under/below another layer, and one or more intervening layers may also be present. In addition, when a layer is referred to as being 'between' two layers, it can be the only layer between the two layers, or one or more intervening layers may also be present.

Although embodiments have been described with reference to a number of illustrative embodiments thereof, numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a light emitting structure including a first conductive semiconductor layer, a second conductive semiconductor layer and an active layer between the first conductive semiconductor layer and the second conductive semiconductor layer;
   a first electrode on the first conductive semiconductor layer;
   a photon escape layer on a portion of the first electrode; and
   a pad on the first electrode,
   wherein the pad is disposed in the photon escape layer, and
   wherein the photon escape layer has a refractive index that is between a refractive index of the light emitting structure and a refractive index of an encapsulating material with respect to the light emitting structure.

2. The light emitting device according to claim 1, wherein the photon escape layer is formed only on an upper surface of the light emitting structure.

3. The light emitting device according to claim 1, wherein the first electrode has a wing type or a lattice pattern.

4. The light emitting device according to claim 1, wherein the photon escape layer is both on the first electrode and the first conductive semiconductor layer.

5. The light emitting device according to claim 1, wherein the photon escape layer includes a dielectric film or a conductive film.

6. The light emitting device according to claim 1, wherein the photon escape layer comprises at least one of $TiO_2$, $Al_2O_3$, ZnO, $MgF_2$, $In_2O_3$, $SnO_2$, $TiN_x$, $Ga_2O_3$, ITO, In—Zn—O, and ZnO:Al.

7. The light emitting device according to claim 1, wherein the pad contacts the photon escape layer.

8. The light emitting device according to claim 1, further comprising:
   an insulating layer around the light emitting structure,
   wherein a material of the photon escape layer is different from a material of the insulating layer.

9. The light emitting device according to claim 8, wherein the photon escape layer is on the insulating layer, the first conductive semiconductor layer and the first electrode at the same time.

10. A light emitting device, comprising:
   a light emitting structure, wherein the light emitting structure includes a first conductive semiconductor layer, a second conductive semiconductor layer and an active layer between the first conductive semiconductor layer and the second conductive semiconductor layer;
   a first electrode on the first conductive semiconductor layer;
   a photon escape layer on a portion of the first electrode;
   a pad on the first electrode; and
   a second electrode under the second conductive semiconductor layer;
   wherein the pad does not vertically overlap with the photon escape layer, and
   wherein the photon escape layer has a refractive index that is between a refractive index of the light emitting structure and a refractive index of an encapsulating material with respect to the light emitting structure.

11. The light emitting device according to claim 10, wherein the photon escape layer is formed only on an upper surface of the light emitting structure.

12. The light emitting device according to claim 10, wherein the first electrode has a wing type or a lattice pattern.

13. The light emitting device according to claim 10, wherein the photon escape layer is both on the first electrode and the first conductive semiconductor layer.

14. The light emitting device according to claim 10, wherein the photon escape layer includes a dielectric film or a conductive film.

15. The light emitting device according to claim 10, wherein the photon escape layer comprises at least one of $TiO_2$, $Al_2O_3$, ZnO, $MgF_2$, $In_2O_3$, $SnO_2$, $TiN_x$, $Ga_2O_3$, ITO, In—Zn—O, and ZnO:Al.

16. The light emitting device according to claim 10, wherein the pad contacts a side surface of the photon escape layer.

17. The light emitting device according to claim 10, further comprising:
   an insulating layer around the light emitting structure,
   wherein a material of the photon escape layer is different from a material of the insulating layer.

18. The light emitting device according to claim 17, wherein the photon escape layer is on the insulating layer, the first conductive semiconductor layer and the first electrode at the same time.

19. The light emitting device according to claim 1, wherein the photon escape layer comprises a transmitting layer.

20. The light emitting device according to claim 10, wherein the photon escape layer comprises a transmitting layer.

* * * * *